(12) United States Patent
Yu

(10) Patent No.: US 6,684,476 B1
(45) Date of Patent: Feb. 3, 2004

(54) HEAT SINK FASTENING STRUCTURE ASSEMBLY METHOD OF USE

(75) Inventor: Che-Min Yu, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/294,639

(22) Filed: Nov. 15, 2002

(30) Foreign Application Priority Data

Aug. 27, 2002 (TW) ...................................... 91213374 U

(51) Int. Cl.[7] .............................................. B23P 11/00
(52) U.S. Cl. ............................ 29/428; 24/457; 24/458; 361/704; 124/16.3; 165/80.3
(58) Field of Search ................. 29/525.01–525.04; 24/457, 458; 361/704; 174/16.3; 165/80.3; 257/718

(56) References Cited

U.S. PATENT DOCUMENTS

| 6,208,518 B1 | * | 3/2001 | Lee ............................. 361/704 |
| 6,318,452 B1 | * | 11/2001 | Lee ............................ 165/80.3 |
| 6,362,963 B1 | * | 3/2002 | Lee et al. .................... 361/704 |
| 6,404,635 B1 | * | 6/2002 | Wei .............................. 361/704 |
| 6,430,049 B1 | * | 8/2002 | Lai et al. ..................... 361/704 |
| 6,452,801 B1 | * | 9/2002 | Chen ........................... 361/704 |
| 6,456,493 B1 | * | 9/2002 | Lee ............................. 361/704 |
| 6,507,489 B1 | * | 1/2003 | McGowan et al. ......... 361/687 |

* cited by examiner

*Primary Examiner*—Gregory Vidovich
*Assistant Examiner*—Stephen Kenny
(74) *Attorney, Agent, or Firm*—Troxell Law Office PLLC

(57) ABSTRACT

The present invention provides a method for assembling heat sink fastening structure. Each of the components in the heat sink fastening structure is composed of elastic materials. The method includes the following steps: (A) first, forming a control lever and a relating lever in one-piece type, the control lever has an operating end, a positioning hole, two lock slots, a pressing ring, and a first gripping jaw; the relating lever has an operating end, a spring, two lock blocks, and a second gripping jaw; (B) second, pushing the two lock blocks up to two corresponding lock slots and making the spring sealed between the control lever and the relating lever; (C) finally, pushing the spring into the positioning hole and putting two lock blocks into two corresponding lock slots. Therefore, the heat sink fastening structure is assembled.

4 Claims, 7 Drawing Sheets

HEAT SINK FASTENING STRUCTURE ASSEMBLY METHOD OF USE

FIELD OF INVENTION

The present invention relates to a method for assembling heat sink fastening structure of CPU in a computer, and more especially, to an improvement in assembling heat sink fastening structure.

BACKGROUND OF THE INVENTION

Since CPU is an extremely important portion in computers, as computer technologies keeping progressing, execution speed and efficiency of CPU are getting higher and higher, and so is heat it brings. The heat dissipation problem must be solved without hesitation. The present invention provides a heat sink fastening structure, which is easy to be assembled to dissipate heat.

Generally speaking, the heat sink fastening structure used on CPU can be divided into two types. One is rivet joint fastening structure with heat sink riveted by drilling holes on them, as shown in FIG. 1A. The other is lock member fastening structure with fastening pieces and lock members pressing on the heat sink closed together, as shown in FIG. 1B.

As shown in FIG. 1A, the rivet joint fastening structure of a conventional heat sink needs additional positioning and drilling operations that bring out higher manufacturing cost. In addition, restricted by requests for size and strength of holes, the rivet joint fastening structure may increase of heat resistance between contact surfaces and results in a worse heat-sinking effect. Furthermore, the rivet joint fastening structure is not able to be disassembled.

Referring to FIG. 1B, another conventional lock member fastening structure is illustrated. By passing the fastening piece 11 through the lock hole 13 and then combining with the lock member 12, a heat sink 1 is tightly integrated in the structure. However, due to needs for additional positioning and drilling operations to keep lock holes 13 and lock members matched, it results in a higher manufacturing cost. Another lock member fastening structure, referring to FIG. 1C, in which lock holes 13 and lock members don't have to match with each other, however, is hard to be assembled and be disassembled for requiring a normal force 14 and a lateral force 15 simultaneously.

In consideration of those drawbacks above, the present invention provides a heat sink fastening structure of low heat resistance among contact surfaces, easy assembly and disassembly, and low manufacturing cost. More particularly, the present invention improves the assembly of the heat sink fastening structure.

SUMMARY OF THE INVENTION

Due to fast development and increased efficiency of CPUs, the ability to heat dissipation becomes more and more important. Relatively, the issue on heat sink fastening structure is of great urgency.

Therefore, the objective of the present invention is to create a heat sink fastening structure of high heat dissipation efficiency, easy assembly and disassembly, low manufacturing cost, and easy fabrication.

Another objective of the present invention is to provide two lock blocks, two lock slots, a spring, and a positioning hole for assembling the heat sink fastening structure.

The present invention provides a method for assembling heat sink fastening structure, composed of a control lever and a relating lever. The control lever has a positioning hole and two lock slots. The relating lever has two lock blocks and a spring. Whereby the two lock blocks are pushed into two corresponding lock slots and the spring is put in the positioning holes for integrating in a whole

DETAILED DESCRIPTION

The above objectives, techniques, methods, and physical structure features of the present invention will be fully understood from the following description of a preferred exemplary embodiment accompanying with drawings as follows.

Figure 1A:
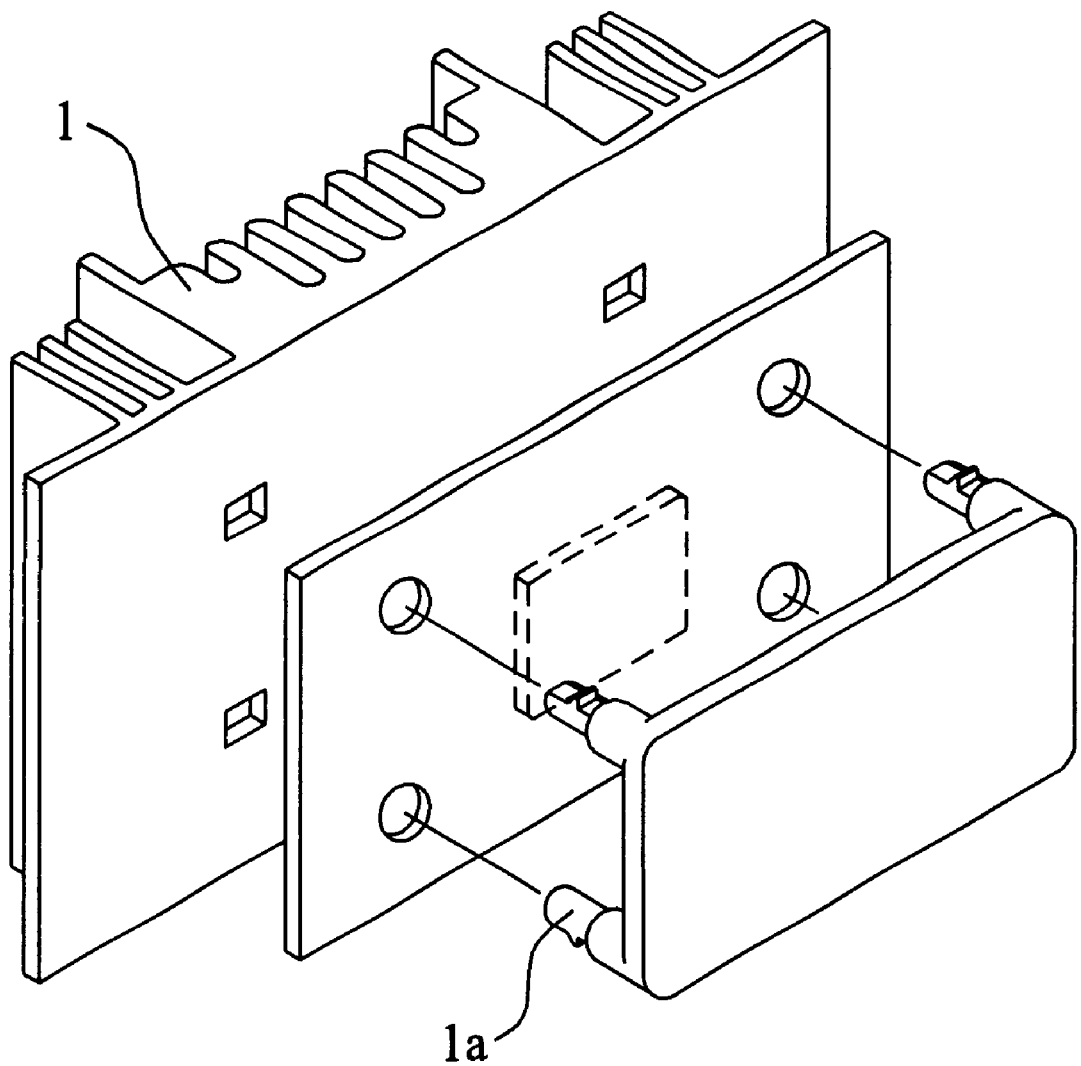
FIG. 1A illustrates a perspective diagram of a rivet joint fastening structure of the conventional heat sink.
Figure 1B:
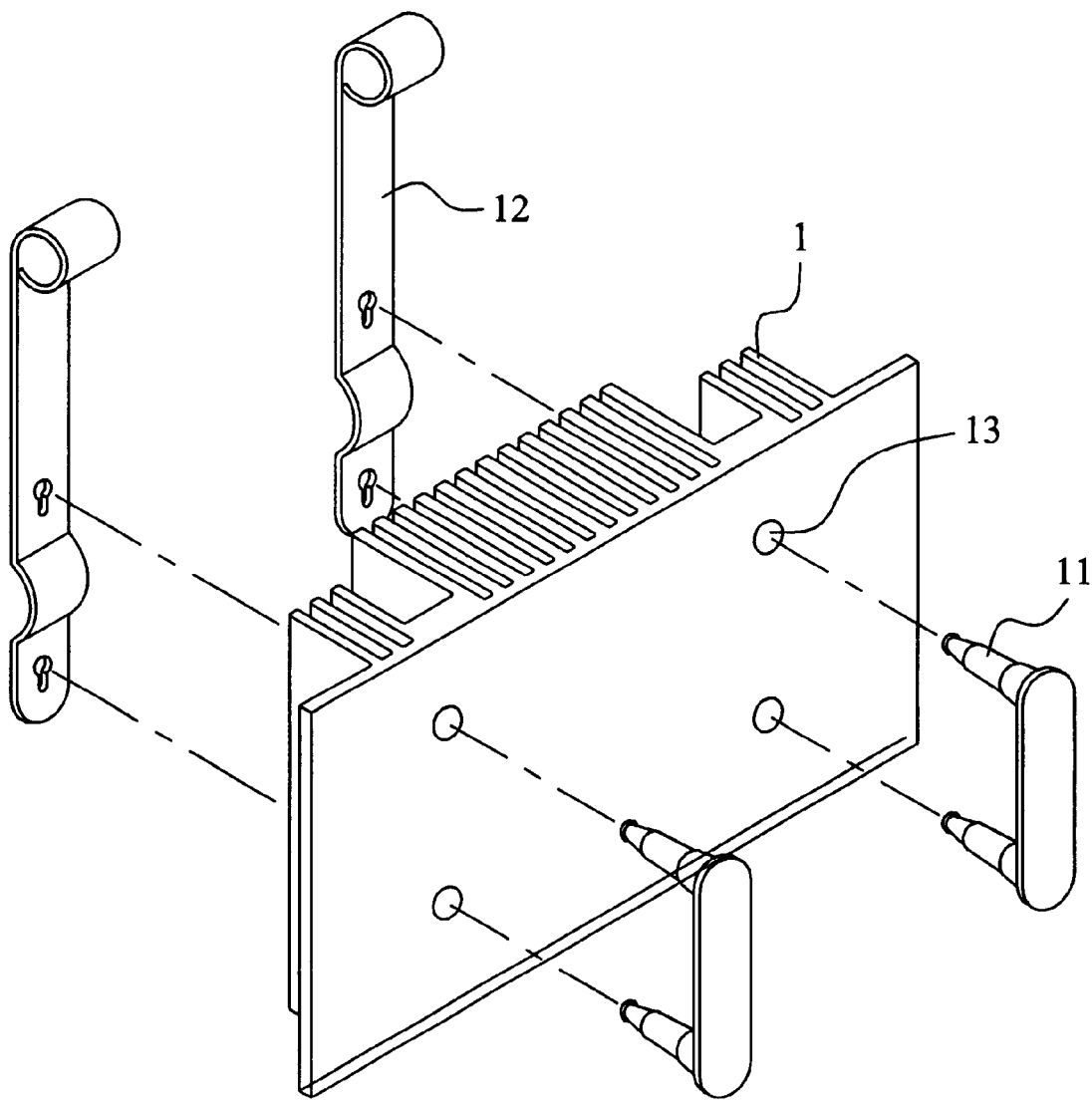
FIG. 1B illustrates a perspective diagram of a lock member fastening structure with fastening pieces and lock holes of the conventional heat sink.
Figure 1C:
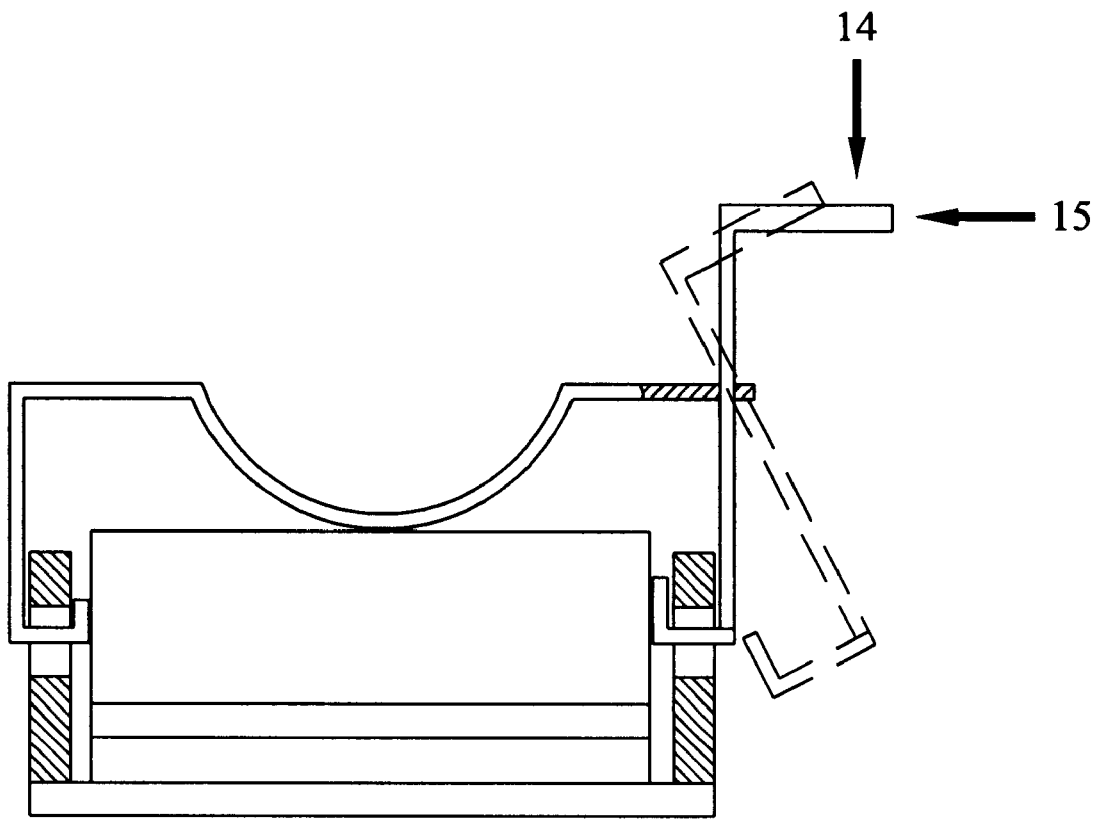
FIG. 1C illustrates a perspective diagram of another lock member fastening structure of the conventional heat sink.
Figure 2:
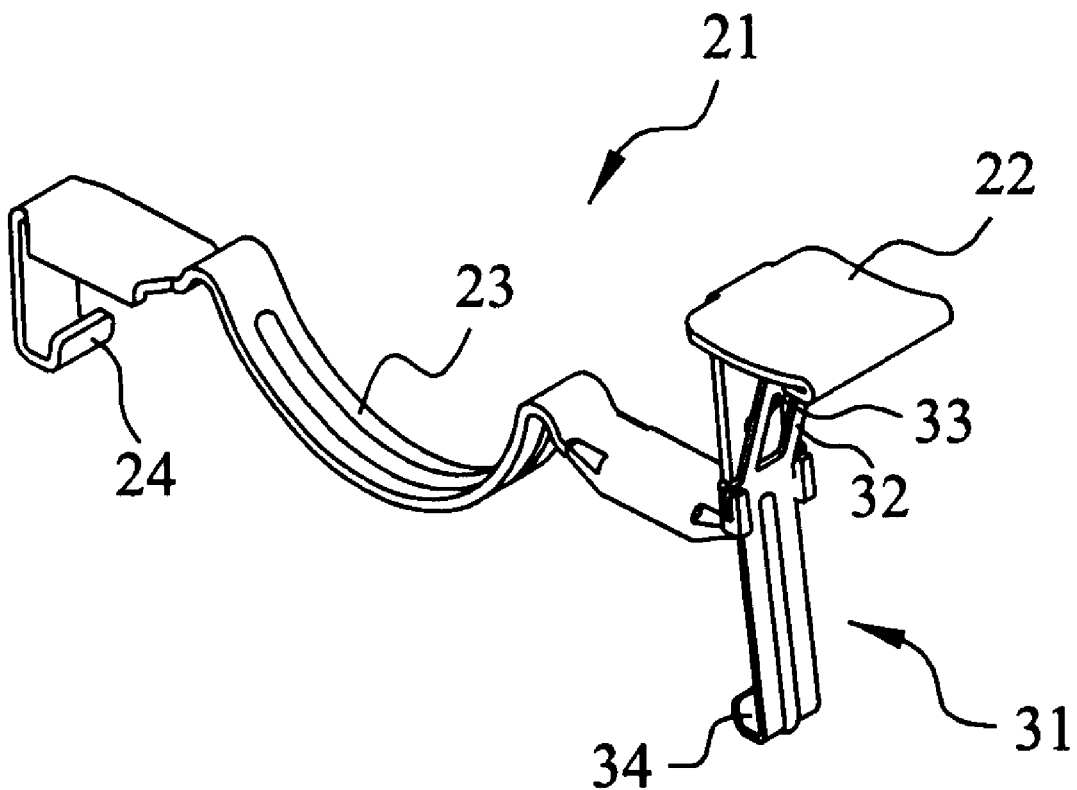
FIG. 2 illustrates a perspective diagram of the heat sink fastening structure of the present invention.
Figure 3:
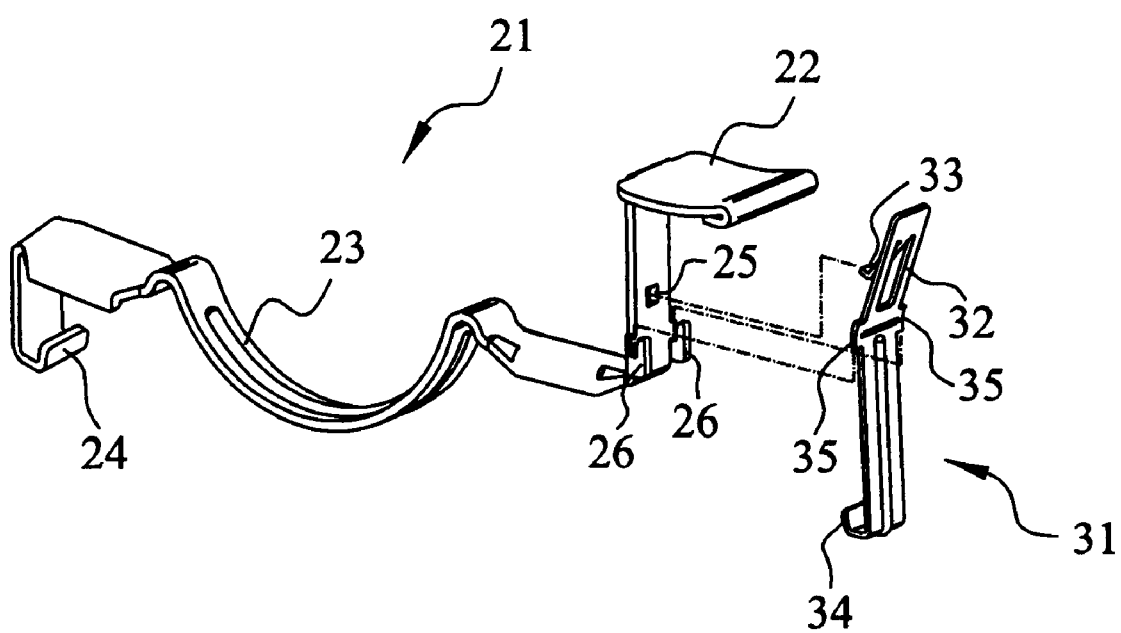
FIG. 3 illustrates a perspective diagram of the heat sink fastening structure in a separation configuration of the present invention.

FIG. 2 shows a heat sink fastening structure of the present invention using a heat sink, wherein the structure is capable of assembling and disassembling of the heat sink, characterized in that: the structure composed of elastic materials includes a control lever 21 and a relating lever 31, as shown in FIG. 3. The control lever 21 has a pressing ring 23, a positioning hole 25, two lock slots 26, an operating end 22 in one end of the control lever 21, and a first gripping jaw 24 with an arch in the other end of the control lever 21. The relating lever 31 is locked up on the control lever 21 and has two lock blocks 35, an operating end 32 in one end of the relating lever 31, and a second gripping jaw 34 with an arch in the other end of the relating lever 31. By using the first gripping jaw 24 and the pressing ring 23, the heat sink can be assembled and disassembled. Wherein, the relating lever 31 can further cooperate with a spring 33 to implement an automatic restoring operation.

Figure 4:
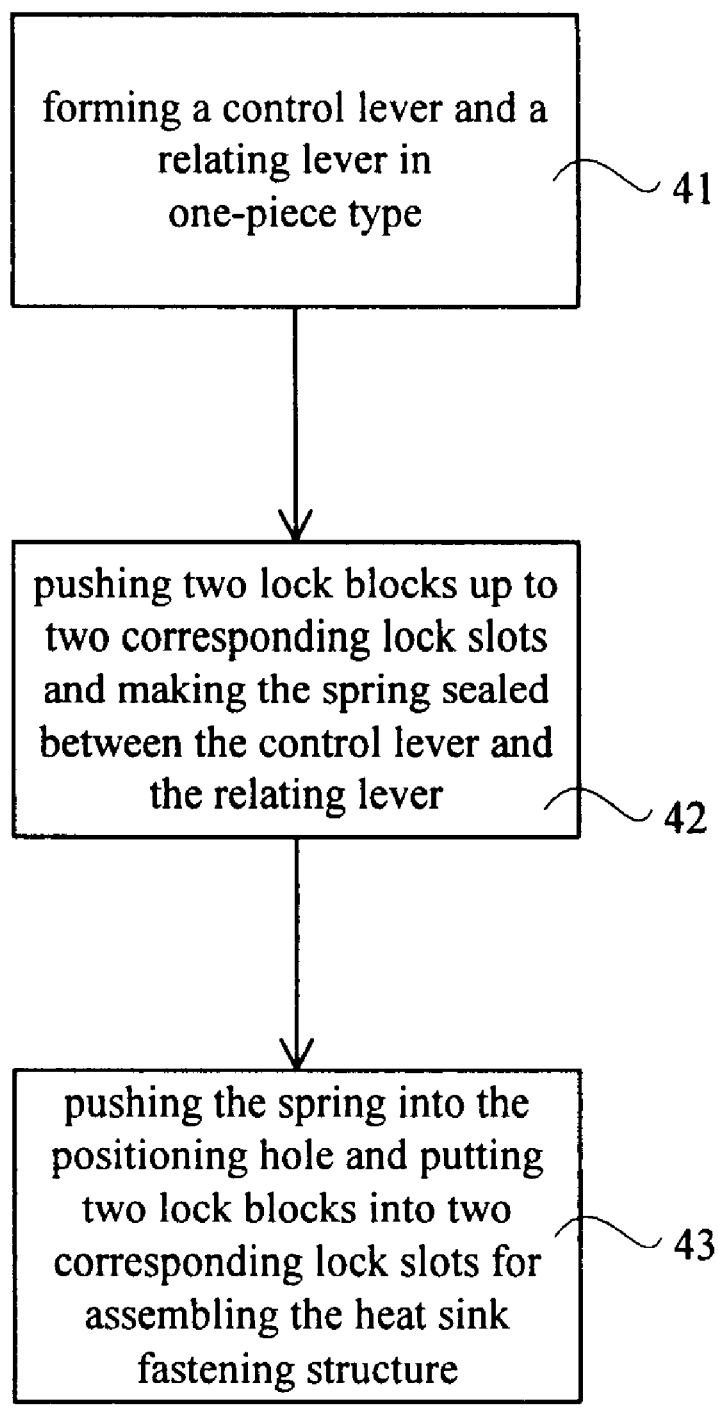
FIG. 4 illustrates a flowchart of assembling the heat sink fastening structure of the present invention.

Referring to FIG. 4, the present invention provides a method for assembling heat sink fastening structure. Each of the components in the heat sink fastening structure is composed of elastic materials. The method includes the following steps:

(A) first, in the step 41, forming the control lever 21 and the relating lever 31 in one-piece type, the control lever 21 has an operating end 22, a positioning hole 25, two lock slots 26, a pressing ring 23, and a first gripping jaw 24; the relating lever 31 has an operating end 32, a spring 33, two lock blocks 35, and a second gripping jaw 34;

(B) second, in the step 42, pushing the two lock blocks 35 up to two corresponding lock slots 26 and making the spring 33 sealed between the control lever 21 and the relating lever 31;

(C) finally, in the step 43, pushing the spring 33 into a positioning hole 25 and putting two lock blocks 35 into two corresponding lock slots 26. Therefore, the heat sink fastening structure is assembled, as shown in FIG. 2.

Figure 5:
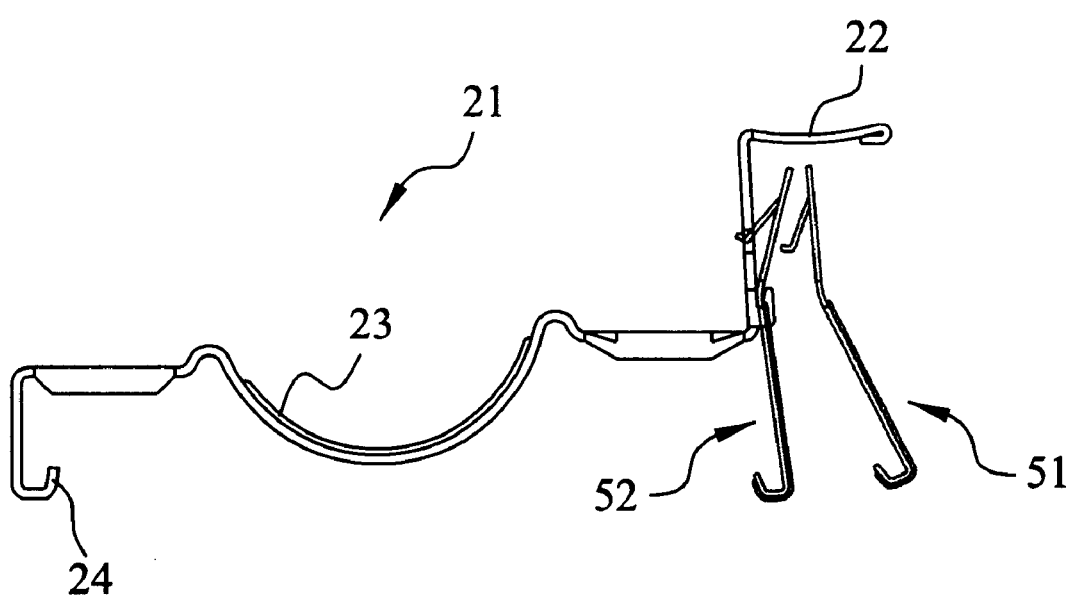
FIG. 5 illustrates a perspective diagram of the heat sink fastening structure in an assembly configuration of the present invention.

Furthermore, referring to FIG. 5, the assembly of heat sink fastening structure of the present invention is fabricated by the control lever 21 and the relating lever 31. According to the corresponding positions of relating lever 51 before being assembled and relating lever 52 after being assembled, the heat sink fastening structure is easy to be assembled and disassembled. Persons skilled in the art may further combine, add, or delete parts into the structure with reference to the present invention to achieve similar effects.

While the present invention has been described with reference to a preferred embodiment, the description is not intended to be constructed in a limiting sense. Various modifications of the embodiment, as well as other embodiments of the invention, will be apparent to persons skilled in the art upon reference to the description. It is therefore contemplated that the appended claims will cover any such modifications or embodiments as fall within the true scope of the invention.

What is claimed is:

1. A method for assembling a heat sink structure comprising the steps of:

a) forming a control lever having a first gripping jaw, two lock slots and a positioning hole;

b) forming a relating lever having a second gripping jaw, a spring and two lock blocks;

c) aligning the two lock blocks of the relating lever with the two lock slots of the control lever and pressing the spring of the relating lever against the control lever; and d) inserting the two lock blocks of the relating lever into the two lock slots of the control lever, and inserting the spring of the relating lever into the positioning hole of the control lever, whereby the first and second gripping jaws face toward each other.

2. The method for assembling a heat sink structure according to claim 1, wherein the control lever is formed as a single piece.

3. The method for assembling a heat sink structure according to claim 1, wherein the relating lever is formed as a single piece.

4. The method for assembling a heat sink structure according to claim 1, wherein the step of inserting further includes the spring providing an automatic restoring operation.

* * * * *